United States Patent [19]
Smith et al.

[11] Patent Number: 5,404,319
[45] Date of Patent: Apr. 4, 1995

[54] TRANSLATION OF BEHAVIORAL MODELING PROPERTIES INTO AN ANALOG HARDWARE DESCRIPTION LANGUAGE

[75] Inventors: David W. Smith, Forest Grove; Kevin P. Nolan, Tigard; Garland J. Bayley, Portland, all of Oreg.

[73] Assignee: Analog, Inc., Beaverton, Oreg.

[21] Appl. No.: 991,646

[22] Filed: Feb. 11, 1993

[51] Int. Cl.⁶ .............................................. G06F 15/60
[52] U.S. Cl. .................................................... 364/578
[58] Field of Search ............... 364/578, 488, 489, 490, 364/491; 395/500

[56] References Cited

U.S. PATENT DOCUMENTS 4,985,860  1/1991  Vlach ................................... 364/578
5,105,373  4/1992  Rumsey et al. ...................... 364/578

OTHER PUBLICATIONS

Duncan et al; "Hi-Pass: Computer Aided Synthesis"; IEEE 1992.
Quayle et al; "Efficient DAG Synthesis"; IEEE 1990.

Primary Examiner—Ellis B. Ramirez
Attorney, Agent, or Firm—Kolisch Hartwell Dickinson McCormack & Heuser

[57] ABSTRACT

A translator (10) begins with a specification for a system, wherein the specification is described in terms of some desired behavior. That behavior is mapped into a hardware description language representation of the behavior, so that the behavior may be simulated. Other synthesis steps may also be derived therefrom. The translator converts abstract descriptions of system or component behavior into analog hardware description language models which can be later used to simulate the behavior of the system by an appropriate simulator.

20 Claims, 11 Drawing Sheets

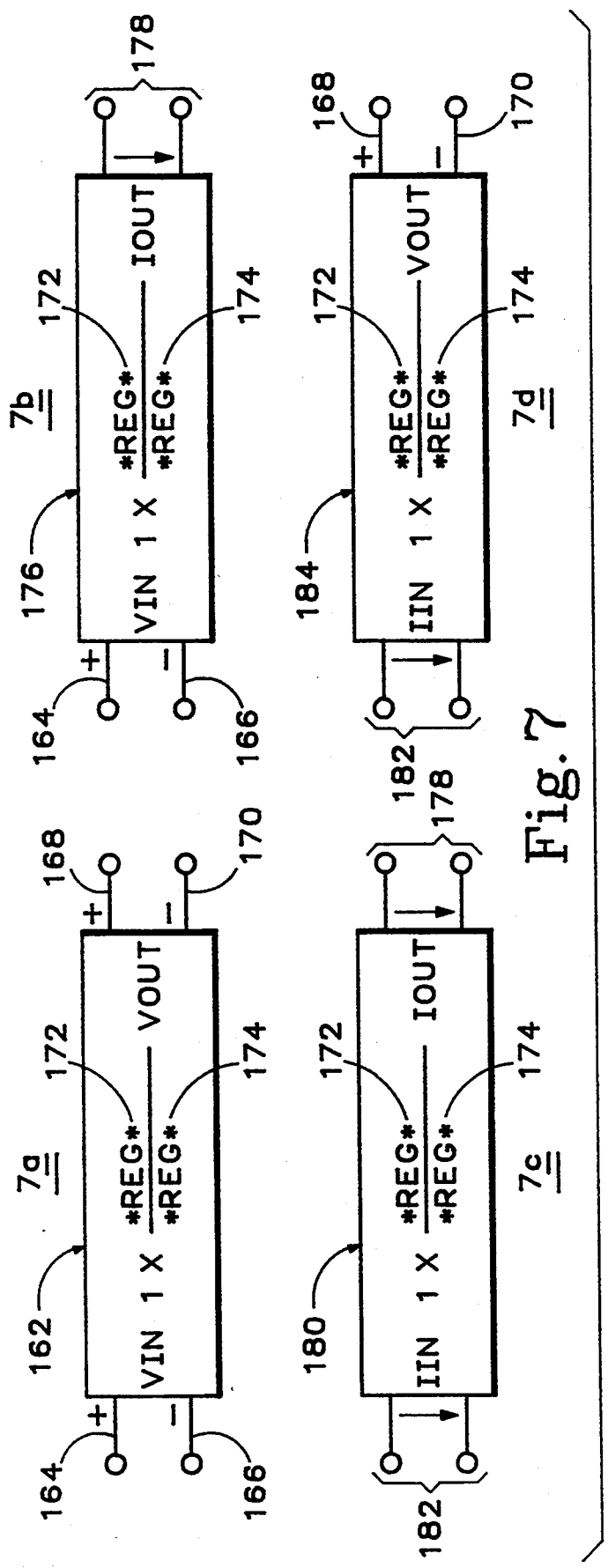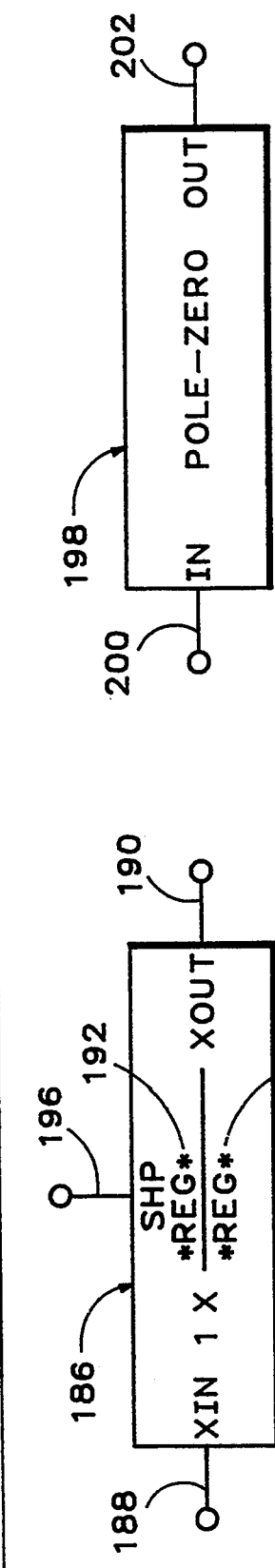

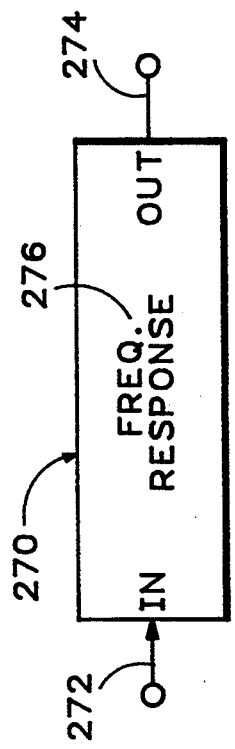
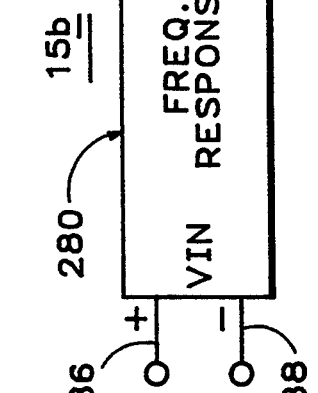
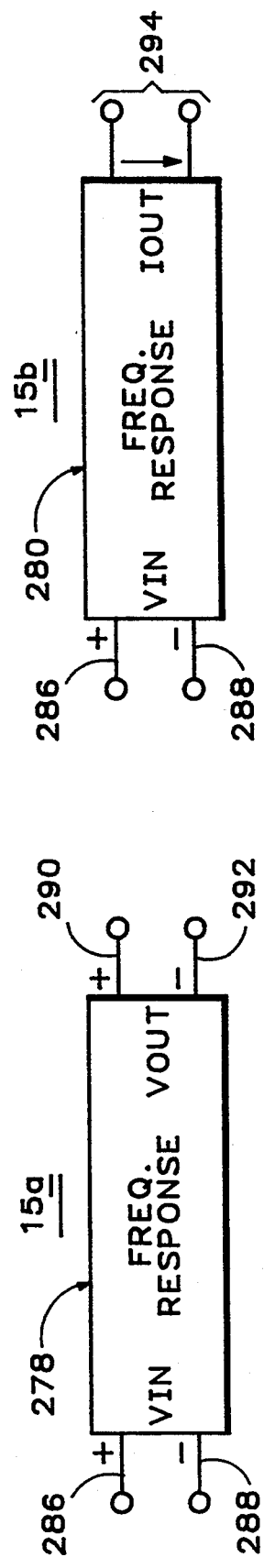
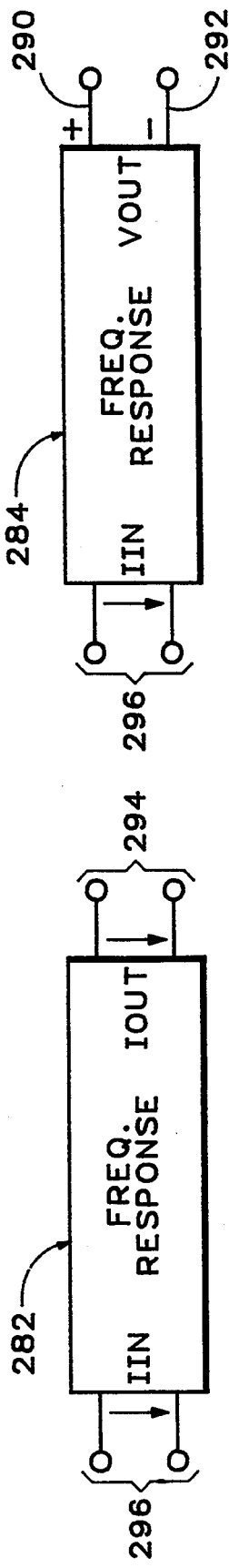
Fig.14
Fig.15

TRANSLATION OF BEHAVIORAL MODELING PROPERTIES INTO AN ANALOG HARDWARE DESCRIPTION LANGUAGE

BACKGROUND OF THE INVENTION

The instant invention relates to translators for translating representations of the behavior of a particular system into another representation. Specifically, the translator of the invention is useful for translating the behavioral modeling properties of a system into an analog hardware description language (AHDL), which may then be used in a simulation of the behavior of the system. Put another way, the translator is capable of extracting behaviors from symbols representing real-world components, and mapping the extracted behavior into a synthesizer, regardless of the normal entry requirements of the synthesizer.

A number of translators are known which will provide a type of synthesis, translating a description of a system in one form to another form. Such translators are used with analog circuit synthesis, filter synthesis, control system synthesis and digital system synthesis. These types of operations all occur in domains which are restricted to either a netlist, wherein the representations which are created are nothing more than "blocks" hooked together, wherein all of the behavior of each block is predefined elsewhere, such as a SPICE library system; or, an operation wherein the synthesis is derived from a control system and a mathematical description of the behavior is generated, in control system format, which is not a true physical representation of the behavior of a system. In such instances, no physical conservation laws are obeyed, no through-and-across variables are usable, and/or the system is merely digital, wherein everything is event-driven, wherein there may be legitimate high-level behavior which includes unidirectional signal flow, but which, again, does not obey physical conservation laws. Such synthesis may get to low level circuitry, such as a transistor type implementation, but again, only in a predefined block implementation format.

A true synthesis, as used herein, occurs where a transformation is performed from a representation of requirements to a representation of the associated implementation. Such a synthesis is generally not a circuit level description, although it is conceivable that eventually, the representation may be expressed as a circuit level description which is derived from a specification of the behavior. The invention described herein represents an initial development in CAE software to synthesize a representation from a specification for a physical system.

The behavior of a physical system may be described in terms of how that system will respond to a stimulus with respect to time or frequency. A system which is described in this way is an abstraction of the physical implementation of such a system. Several formulations for these abstractions have been developed in the past, and large bodies of mathematical theory have been developed from them. The formulations for describing systems exhibiting classical physical behaviors include: a system of ordinary nonlinear algebraic differential equations, the Laplace transform expressed as the product of rational polynomials in S, and a frequency response curve expressed as a list of frequency, magnitude and phase triplicates. In sampled data systems, behavior is usually described as a Z-domain transform expressed as the product of rational polynomials in Z or poles and zeros in Z.

System simulators, such as the System Performance Simulator described in U.S. Pat. No. 5,092,780, issued Mar. 3, 1992, describe an analog hardware descriptive language. Using a hardware description language (HDL) requires that the user learn rules and details for generating even the simplest model which is to be simulated. Such models may either be macro-models or may be primitive models. A hardware description language is useful because the behavior may be defined exactly and with great accuracy.

The invention described herein reduces the drawbacks of using a hardware description language because the user is allowed to define the model in terms of the appropriate behavior which is being defined, and is not required to learn the intricacies and details of the hardware description language.

Summary of the Invention

The translator described herein begins with a specification for behavior of a system, wherein the specification is described in terms of some desired behavior, and that behavior is mapped into a hardware description language representation of the behavior, so that the system may be simulated, and have other synthesis steps derived therefrom. The translator provides a qualitatively different embodiment of the system, which is projected into a "block" which has a predefined behavior in the hardware description language which is not present in the physical block which has been created. The behavior of the block must be defined as the block is created.

While the behavior of an entire system may be expressed using the above abstractions, it is often desirable to describe the behavior of some part of the system by itself and then describe how the behavior of this subsystem is related to the rest of the system. This is known as a hierarchial description. Such descriptions are often represented as a network of components, with each component being itself a network of components. The behavior of each component, or block, may be described abstractly using some of the formulations identified above, or as the actual physical implementation of some abstract behavior. An analog hardware description language supports these capabilities, and thereby provides an organizing principle to guide the development of a large, complex system in a structured way.

The translator of the invention converts abstract descriptions of system or component behavior into analog hardware description language models which can be later used to simulate the behavior of the system by an appropriate simulator. The input to the translator is a behavioral description of a system or components expressed as one of the following: (1) a system of ordinary nonlinear algebraic differential equations with respect to time, (2) a Laplace transform expressed as the product of rational polynomials in S, (3) a Z-domain transform expressed as the product of rational polynomials in Z, (4) a set of poles and zeros in S, representing the roots of the numerator and denominator of the associated transfer function in S, (5) a set of poles and zeros in Z, representing the roots of the numerator and denominator of the associated transfer function in Z, or (6) a frequency response expressed as a list of frequency, magnitude and phase triplets.

Additionally, if the component is a sub-system, the translator must be told how this component is connected to the rest of the system. The translator must be given a template of the specific behavioral modeling language entity to be generated along with a behavior description of the system. The translator, therefore, analyzes an abstract behavioral description of a system and from it synthesizes a model expressed in a appropriate analog hardware description language.

Model synthesis is the process of mapping, from an abstract description of an entity behavior to the actual implementation of a model in the HDL of choice. A given abstract description may be mapped into multiple levels of complexity. For instance, an S polynomial describing a transfer function may be mapped to a behavior model containing no structural elements. Additionally, the same description may be mapped to a structural model containing several behavioral elements corresponding to the stages of a multi-stage filter. Similarly, this description may then be mapped to an actual physical implementation containing silicon compound-based physically realized components, such as transistors, capacitors, inductors and resistors. Each level of abstraction is a behavior-preserving decomposition of a level above. Each model implementation is functionally equivalent to the other, the only difference being in the level of detail provided. Synthesis includes, but is not limited to synthesis of behavior, synthesis of structure, and synthesis of HDL descriptions of actual physical circuit implementations, using known components and values.

The translator of the invention is useful for translating a requirements specification for a system having system components, a behavior description for each component and a template therefor, into another representation of the system. The translator includes an extraction module for extracting behavior descriptions from the specification, an analysis module for reducing the behavior description to a mathematical description of the components of the system and at least one synthesis module for mapping the mathematical depiction into another representation of the system.

These and other objects and advantages of the invention will become more fully apparent as the description which follows is read in conjunction with the drawings.

BRIEF DESCRIPTION OF THE DRAWINGS

FIG. 7 is an S-domain rational polynomial model for a physical system.

FIG. 8 is a Z-domain rational polynomial model for a control system.

FIG. 9 is an S-domain pole/zero model for a control system.

FIG. 14 is a frequency response model for a control system.

FIG. 15 is a frequency response model for a physical system.

DETAILED DESCRIPTION OF THE PREFERRED EMBODIMENT

Figure 1:
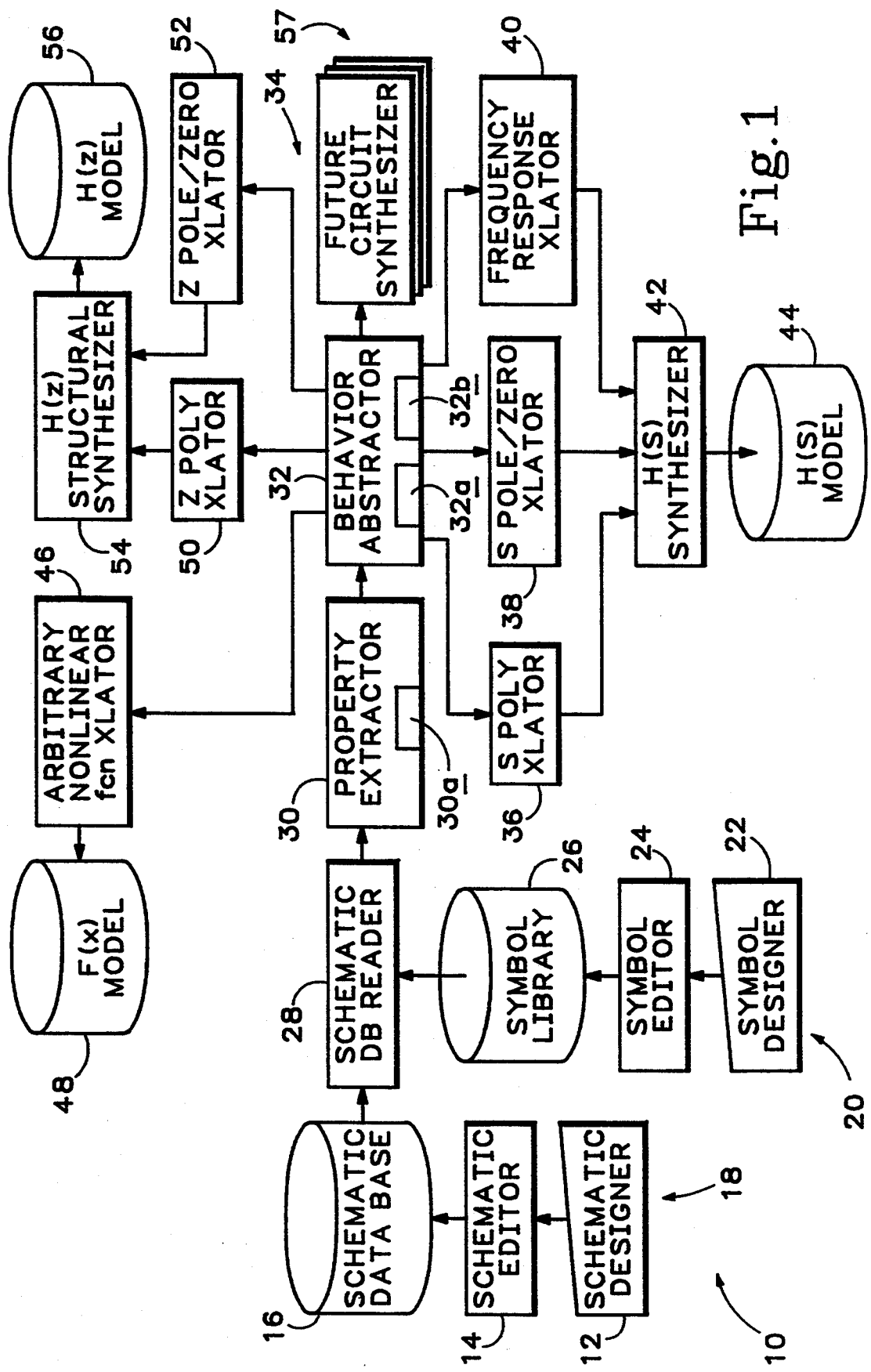
FIG. 1 is a block diagram of the translator of the invention.

Referring initially to FIG. 1, the translator of the invention is depicted generally at 10. Translator 10 includes a schematic designer 12, a schematic editor 14 and a schematic database 16. Schematic designer 12, schematic editor 14 and schematic database 16 comprise what is referred to herein as the schematic portion of the translator, indicated generally at 18. Translator 10 is operable to translate a specification for a system into another representation of the system. The system, which will be described in a specific example later herein, includes system components, a behavior description for each component, and a template for each component.

A symbolic portion of the translator, indicated generally at 20, includes a symbol designer 22, a symbol editor 24 and a symbol library 26. Symbol portion 20 is operable to build various symbols, such as symbols that correspond to templates, symbols that use graphical modelint;, and hierarchial symbols that represent a schematic.

Data from schematic database 16 and from symbol library 26 are input into a schematic database reader 28. Schematic database 16 and symbol library 26 define a representation of a specification for a system which is to be translated into another representation of the system. A property extractor, or extraction module, 30, receives the output of schematic database reader 28 and extracts a behavior description from the system specification. Extractor 30 includes an analysis mechanism which determines whether or not the schematic designs and symbols which have been input thereto are in the proper form for analysis and translation by the rest of the system.

Property extractor 30 includes a mechanism 30a for determining the nature of the output of schematic database reader 28 and determines whether there is a need for behavior modeling properties. Abstractor 32 includes a comparison module 32a which compares the mathematical depiction of the behavior properties of a component to the available synthesizer:5 to determine whether the behavior of the component may be mapped into the other representation. This is accomplished by tagging, with a tagging module, a component representation with a keyword or "discriminator" which provides an indicator of the type of properties contained in the component representation. If the keyword does not match an active synthesizer, an output facsimile, or netlist, of the component in its non-acceptable form is generated by an output module, which will be described later herein.

Once the properties have been extracted, the behaviors of such properties are abstracted by behavior abstractor 32. Comparison module 32a determines whether or not the output is in the form of an S polynomial, a frequency specification, a Z polynomial, a Z pole/zero or some other function, including but not limited to the conservation of physical quantities requirements for physical/electrical systems, the signal-flow semantics which govern control system the event-driven semantics for digital systems, and the data-flow semantics used by communication systems.

Behavior abstractor 32 also includes a behavior specific normalizer, or normalizer mechanism 32b. The behavior specific normalizer mechanism determines a specific character of a component from the behavior description thereof contained in the character set for the component.

Behavior abstractor 32 determines the types of behaviors which the properties of the schematic diagrams and the symbols contain, converts the behavior into a simplified normal form, and directs particular instances of these behaviors to behavior specific translators. Such behavior specific translators are depicted generally at 34, and are referred to herein collectively as an analysis module, which includes a graphical interface module and which is operable to reduce the behavior description of the system to a mathematical depiction of the component of the system. The mathematical descriptions, of course, must obey conservation of physical properties laws for electrical and physical systems. In the case of behaviors which are defined by S polynomials, abstractor 32 directs such behaviors to an S polynomial translator 36. If the function is an S pole/zero function, it is directed towards S pole/zero translator 38. In the case of a frequency response behavior, the behavior abstract is directed towards frequency response translator 40. Translators 36, 38 and 40 direct output to an H(s) synthesizer, or synthesis module, 42, which combines the appropriate abstracted behaviors to form an H(s) model 44.

If behavior abstractor 32 determines that the input is a system of ordinary, nonlinear algebraic and differential equations with respect to time, abstractor 32 directs output to a translator 46 for such function, which results in an F(x) model 48.

A Z-domain transform, which is expressed as the product of rational polynomials in Z, is directed towards a Z polynomial translator 50. If the behavior is defined as a set of poles and zeros in Z, representing the roots of the numerator and denominator of the associated transfer function in Z, it is directed towards a Z pole/zero translator 52. Output from translators 50, 52 are directed towards a H(z) structural synthesizer, or synthesis module, 54 which has as its output, a H(z) model 56.

A future circuit synthesizer block is depicted at 57. While the embodiment of the invention which is disclosed herein contains specific translators and synthesizers for six forms of representations, the invention as a whole is not limited to the described set. The translator of the invention is designed so that the synthesis path is directed by the contents of a single property, which is associated with a particular symbol.

In the examples presented herein, the specific property is designated as the "model_generator" property. As new synthesizers are required, the name of the specific synthesizers is merely entered into a table of available synthesizers known to the translator of the invention. A reference to the synthesizer module is associated with the synthesizer name. The specific synthesizer is invoked when a symbol bearing the name of the module generator is encountered by behavior abstractor 32. This structure allows specific synthesizers for other HDLs to be added in a modular fashion without disturbing or reorganizing the invention as a whole. Additionally, new synthesizers may be added to implement new, or as yet unknown circuit technology, such as gallium arsenide, optical computers, or biological computers, as these technologies evolve and/or become commercially viable.

Figure 2:
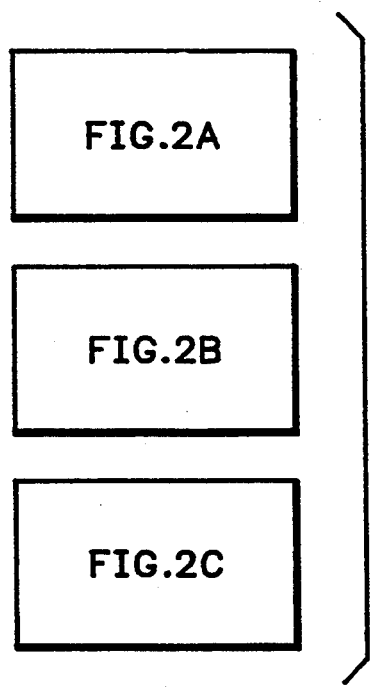
FIG. 2 is a flow chart of the operation of the translator of the invention.
Figure 2A:
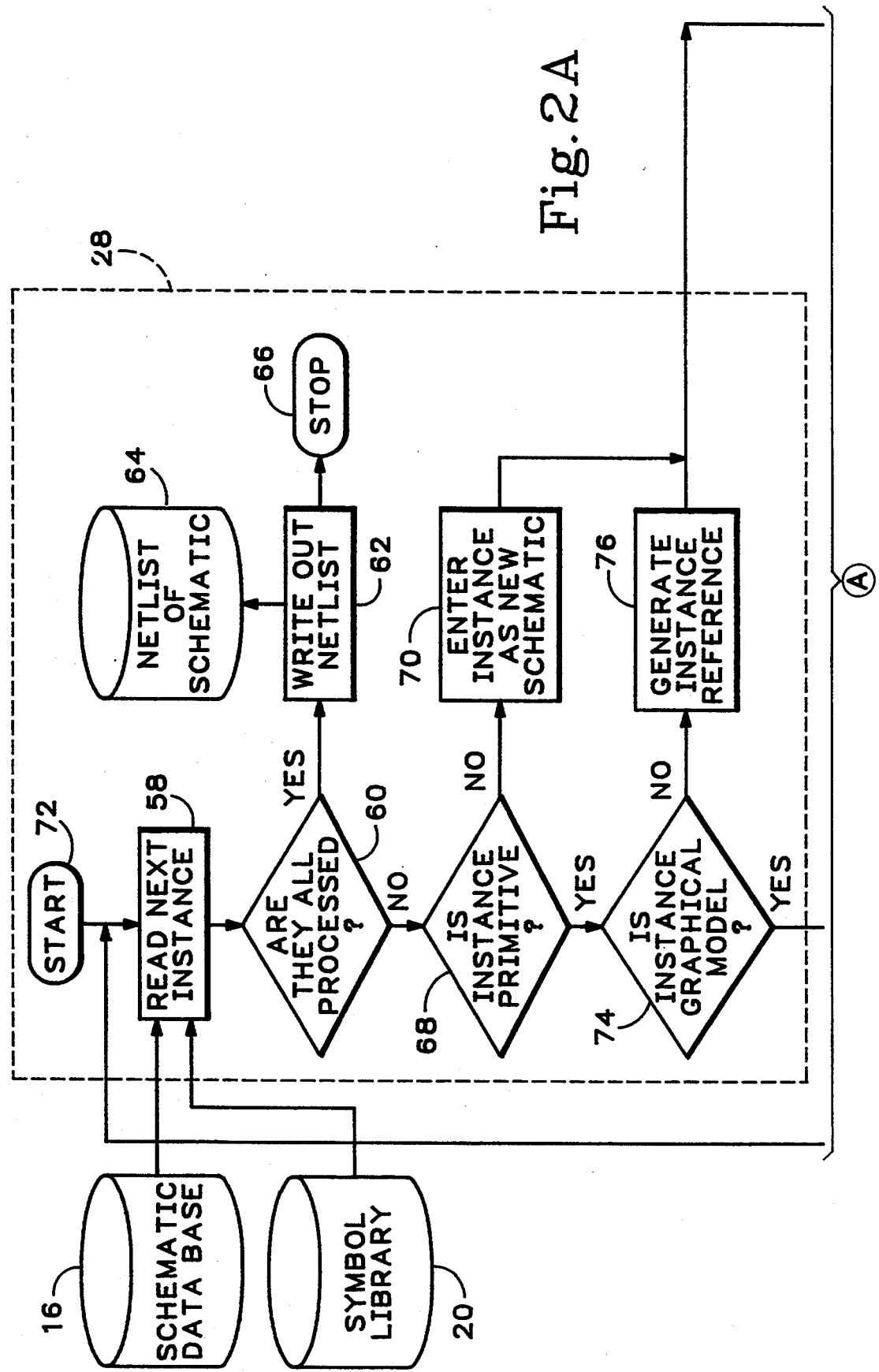
Figure 2B:
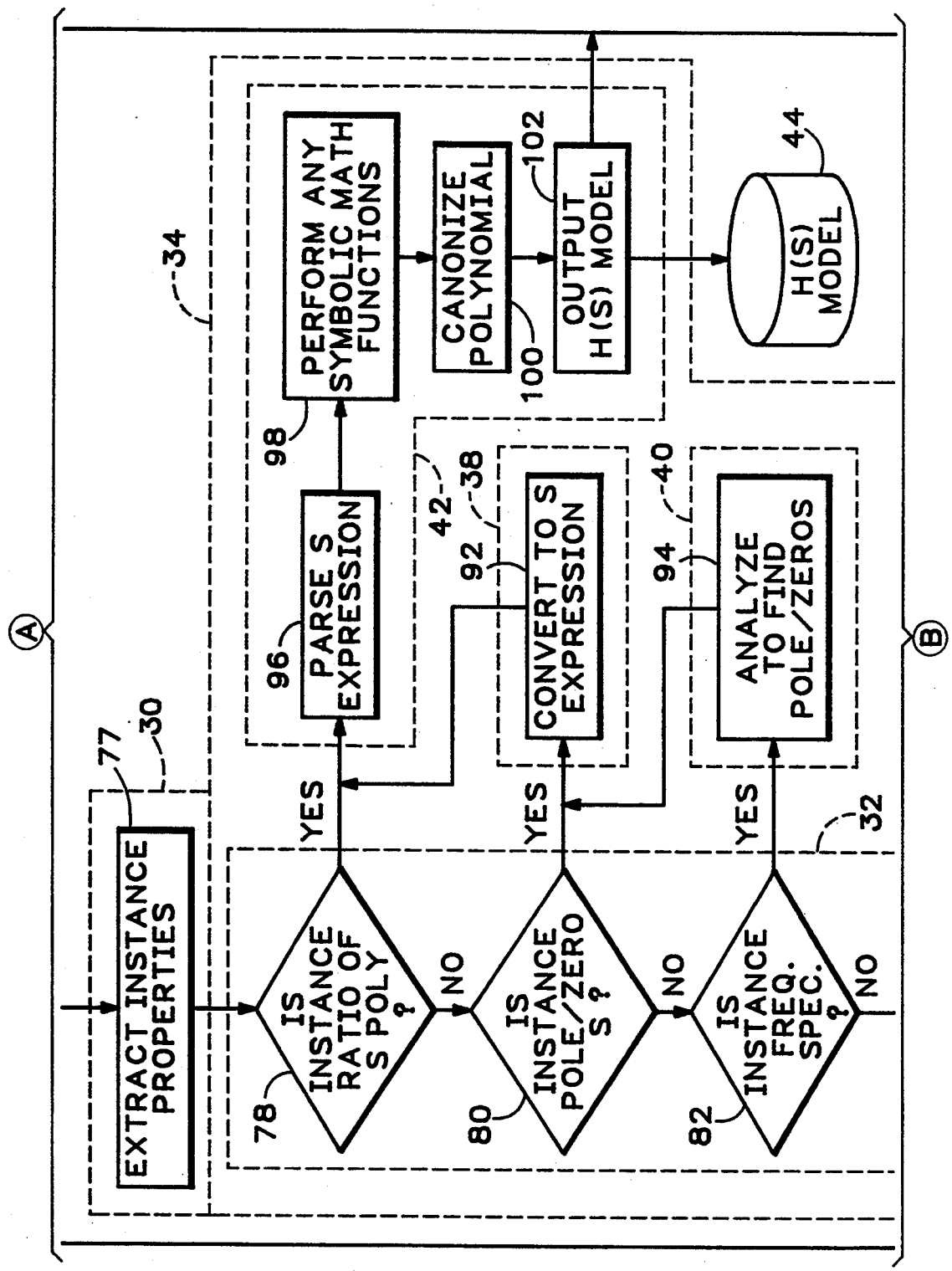
Figure 2C:
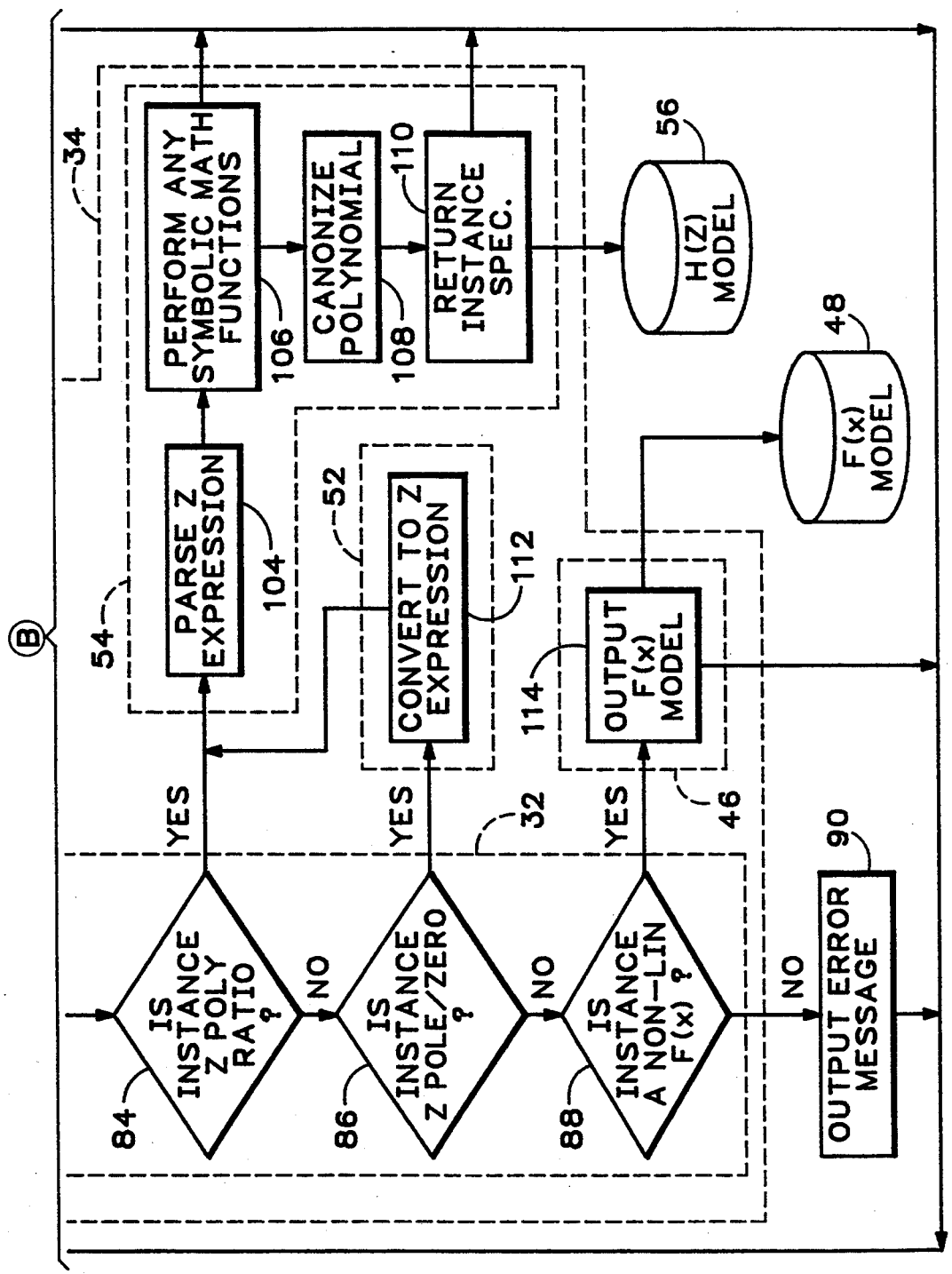

FIG. 2 spans four sheets labelled FIGS. 2A, 2B and 2C the last three listed of which are organized and interrelated as suggested by the first listed a flow chart of data through translator 10. References hereafter to FIG. 2 will be understood to refer collectively to FIGS. 2A, 2B and 2C. Input from schematic database 16 and symbol library 26 is provided generally into schematic database reader 26 and specifically to a "read next instance" block 58. Reader 28 analyzes the input information to determine the nature of the information. If it is determined that all of the data represent processes, block 60, the translator generates a netlist, block 62, which is output as a netlist of the schematic database, block 64 and the translator stops, block 66. Block 62, also referred to herein as an output module, will also generate a netlist for a component if the component is in a nonacceptable form, i.e., is not usable by the translator, as may be the case if the component representation is in a form which cannot be synthesized by the translator, and does not result in a keyword or discriminator match.

If any of the data do not represent processes, the data are analyzed to determine if the information is provided in a primitive form, block 68, which is referred to herein as a decision module. If the data are not provided in a primitive form, a new schematic is read that represents the data, block 70, and the cycle returns to the start of the analysis, block 72. If, in block 68, the data are determined to be in primitive form, it is further analyzed, block 74, to determine whether the data is in the form of a graphical model. If the data are not in the form of a graphical model, a reference for the data is generated, block 76, and the cycle returns to start block 72.

If the data are determined to be in the form of a graphical model, the data are passed to graphical model interface 34, through property extractor 30 and behavior abstractor 32. Behavior abstractor 32 includes a series of logic steps which determine the nature of the behavior of the input data. Comparison module 32a compares the mathematical depiction of the behavior properties of the initial form of a system component to the other form component representations by matching the properties to the keywords.

The input to the behavior extractor is analyzed to determine how the behavioral description of the system or components is expressed. The behavior abstractor determines whether the input is a system of Laplace transforms expressed as the product of rational polynomials in S, block 78; a set of poles and zeros in S, representing the roots of the numerator and denominator of the associated transfer function in S, block 80; a frequency response expressed as a list of frequency, magnitude and phase triplets, block 82; a Z-domain transform, expressed as the product of rational polynomials in Z, block 84; a set of poles and zeros in Z representing the roots of the numerator and denominator of the associated transfer function in Z, block 86; or a system of ordinary nonlinear algebraic and differential equations with respect to time, block 88. If the input is determined to be none of the preceding functions, an output error message is generated, block 90, which is also referred to herein as an error-checking module. The data are "transferred" to block 58 and ultimately to output module 62 for outputting an output facsimile of any component which is not linked to another form representation keyword match by said comparison module 32a.

Looking at the function blocks of behavior abstractor 32 in sequence, if the input is determined to be a Laplace transform expressed as a product of rational polynomials in S, the S polynomial translator passes the data to the H(s) synthesizer, or synthesis module, 42.

If the input is determined to be in the form of a set of poles and zeros in S, the S pole/zero translator 38 converts the data to an expression of rational polynomials in S and passes the data to H(s) synthesizer 42. If the input is determined to be in the form of frequency response, the data are analyzed to find poles and zeros in S, block 94, after which the data are converted to a rational polynomial in S.

H(s) synthesizer 42 initially parses the expressions which it receives, block 96, performs symbolic math functions, such as polynomial multiplication, scaling and exponentiation, which are required, block 98, canonizes the polynomial, block 100 and provides the output, block 102, in the form of a H(s) model, block 44.

Another portion of the behavior specific translator analyzes the data input to determine whether the input is in the form of a Z-domain transform expressed as a product of rational polynomials in Z, block 84. If such is the case, the data are passed to the H(z) structural synthesizer, where the Z expression is parsed, block 104. The parsed expression is then manipulated as the subject of any symbolic math operations which must be performed, block 106. The results are manipulated to canonize any polynomials, block 108. The translator then returns to the system of the H(z) specifications, block 110, resulting in the output of a H(z) model, block 56.

Any remaining data input that is not in the from of a Z polynomial ratio is analyzed to determine whether it is a set of poles and zeros in Z, which are converted to Z polynomial expressions, block 112, by the Z pole/zero translator 52, wherein the data are output to the H(z) synthesizer. If, finally, the data are determined to be in the form of a system of ordinary nonlinear algebraic and differential equations, the output model is generated, block 114, resulting in the F(x) model 48.

The various translators include table forming modules for forming a property-value table for each component from the property-value pairs associated with a component. An example of a property is input, while an example of a value for the property input is vin.

Operation

Figure 3:
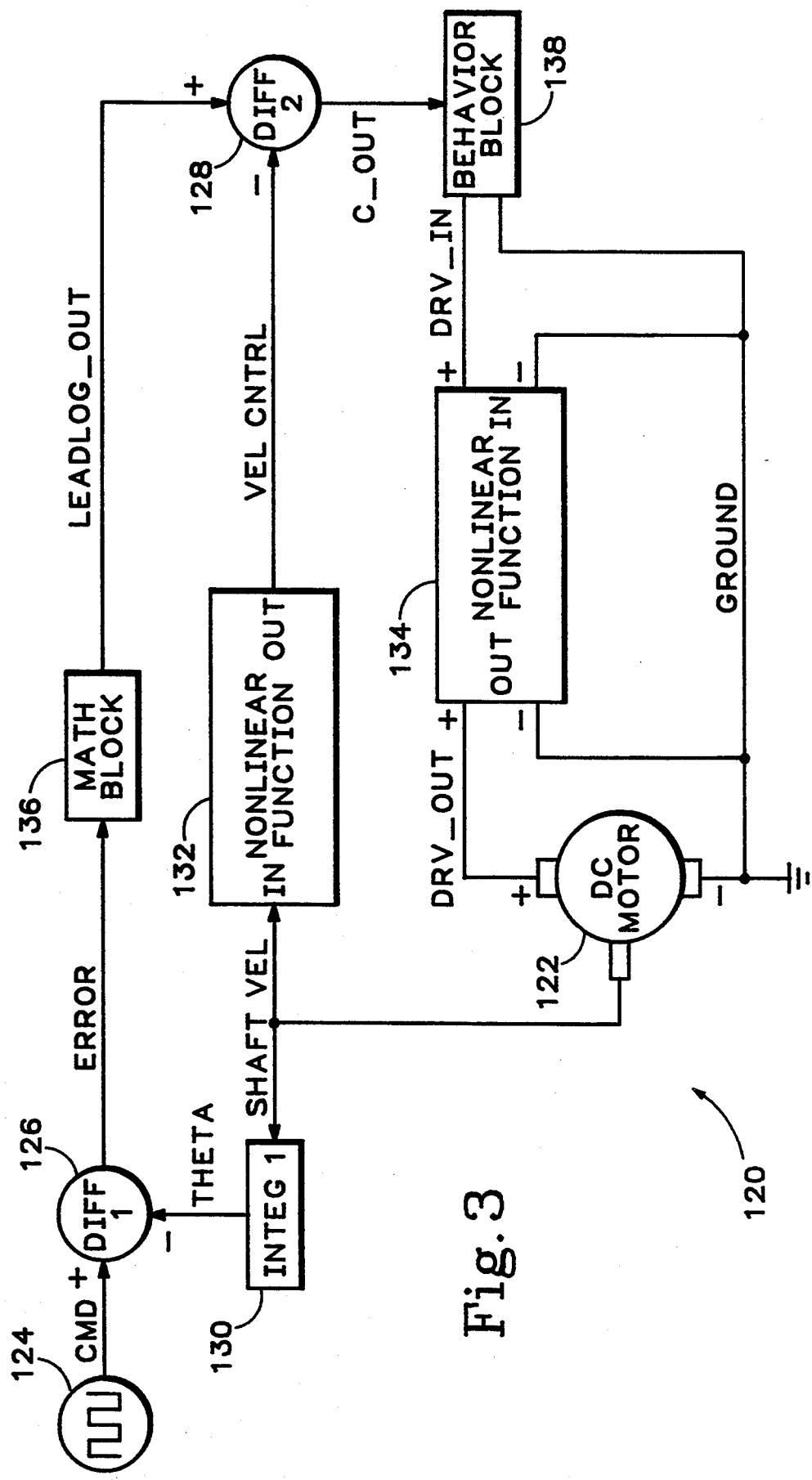
FIG. 3 is a motor control system which incorporates graphical models formed according to the invention.

Referring now to FIG. 3, a motor control system which incorporates graphical models formed according to the invention is depicted generally at 120. System 120 includes a DC motor 122, a pulse source 124, difference blocks 126, 128, an integrator 130, a first nonlinear function box 132, a second nonlinear function box 134, a math block 136, and a behavior block 138. The individual blocks will be described and manipulated using graphical modeling to result in a simulation of the motor control system depicted at 120. Prior to performing a simulation, the behaviors of the components will be translated into an analog hardware description language by the translator of the invention.

To briefly describe how the motor control system is generated, a user initially identifies the system to be graphically modeled and simulated. The user then selects the pieces, or components, which are to go into the system. Simultaneously, or at a later point in the use of the graphical modeling system, property values, or parameters, for the pieces or components, may be defined to provide quantitative simulation of the system which is being simulated.

In the specific example given in FIG. 3, a possible sequence of events to layout motor control system 120 is to initially place pulse source 124. For purposes of illustration, assume that property values or parameters are defined as the individual components are selected and placed. Next, difference block 126 is placed adjacent pulse source 124 and assigned a reference of diff1. Difference block 128 may then be placed, and assigned a reference such as diff2.

Integrator 130 may be positioned and assigned an identity of integ1. For the particular system being designed, the integrator should be mirrored about the y-axis such that the input is at the right hand of the integrator and the output is at the top thereof. If the integrator is not properly positioned, it may be moved or rotated in order to properly orient the integrator.

DC motor 122 may be positioned and identified as motor1. The components which have been identified so far represent "signal flow" models which have unidirectional connections and do not require that physical quantities be conserved. Electrical models, however, such as the DC motor and the signal source, require conservation of the physical quantities, such as current and voltage, which provides two distinct type of signal types which may not be directly connected to one another. The provision of a "control to electrical" converter enables translation between control and electrical signal types. Behavior block 138 represents such a converter and may be positioned below diff2.

Next, the graphical modeling features of the invention are utilized. Math block 136 is, in this instance, an S-domain rational polynomial model for control system 120. The block is identified as ratio1, gain is set to 1000, the numerator is defined as:

$$5*s+6,$$

and the denominator is defined as:

$$s**2+1125*s+1200.$$

At a later point in time, a netlist will be generated and a template file named hins.sin will be generated which describes this model. The model is set forth in the block as:

$$out/in = 1000(5s+6)/(s^2+1125s+1200).$$

The next step in the example is to define the parameters for first nonlinear function block 132. For instance, the properties of the block may be defined as a primitive such as deadbnd, the reference as arbfun1 and a first equation defined as:

$$out = if\ in < -10\ then\ 25* (in+10)\ else\ if\ in > 10\ then\ 25*(in-10)\ else\ 0.$$

The preceding has defined the value of eq1 as a mathematical expression for a "deadbnd" control system function wherein the equation is a conditional expression that returns the value depending on which of the stated conditions is true. This is an example of the MAST ® modeling language.[1]

[1] MAST ® is a registered trademark of Analogy, Inc.

The translator uses the property called "primitive" to name a template file that is to be generated, in this case, deadbnd.sin.

The next step is to generate a nonlinear electrical model using the graphical modeling abilities of the translator. The model may be directly connected to the circuitry as it obeys Kirchoffs current and voltage conservation laws. This is done with second nonlinear function block 134 which is set up to be clipper circuit, and contains the appropriate equations that are implemented as a circuit-level model. In this case, the primitive is defined as clipper, and is referred to as arbrun2. The equations are defined:

$$iin = 0 \quad \text{eq 1}$$

$$vout = \text{if } vin < -12 \text{ then } -12 \text{ else if } vin > 12 \text{ then } 12 \text{ else } vin \quad \text{eq 2}$$

The first equation specifies that the input of this model is open, i.e, has an infinite input impedance, value. The second equation specifies that the output is driven by a clipped version of the input. The template file named clipper.sin will be generated from these specifications.

At this point, the blocks in the control system have been defined, and the circuit is completed by making connections as depicted in FIG. 3. At this point in the operation, the netlists are generated, and a simulation may be conducted, as system 120 has now been translated using graphical modeling into a collection of equations which are suitable for a mathematical simulation. An example of netlist generation is provided later herein, after the description of graphical modeling. Simulation may be conducted on a system simulator, such as described in U.S. Pat. No. 5,092,780, previously identified herein.

Figure 4:
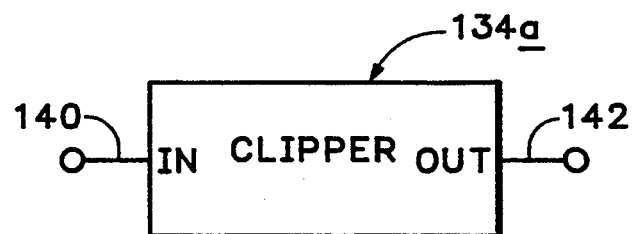
FIG. 4 is a clipper circuit device formed according to the invention.

A number of modifications may be made to system 120 in order to provide a more visual interpretation of the circuit. For instance, function block 134 may be modified, thereby forming a new graphical model and symbol which may be used and stored in a library, thereby facilitating its use in future translations. Block 134 begins with four connections, two of which are connected to the ground of the system. The symbol may be changed to that depicted in FIG. 4, which is a clipper 134a, which has an input 140, an output 142 and a ground 144.

Once the "artwork" has been changed and the proper connections made, clipper 134a may be defined as a primitive: clipper, having the following properties:

| Property | Value |
|---|---|
| branch1: | vin = v(inp,ground), iin = i(inp->ground); |
| branch2: | vout = v(outp,ground), iout = i(outp->ground). |
| eq1: | inn=0 |
| eq2: | vout = if vin <−12 then −12 else if vin > 12 then 12 else vin. |

Additionally, properties for pin_type(inm) and pin_type(outm) may be defined in the properties of the pins defined as:

pin_type(ground): electrical.

At this point, nonlinear function block 134 may be replaced with the clipper model 134a, having the desirable mathematical properties as well as the single ground wire.

Figure 5:
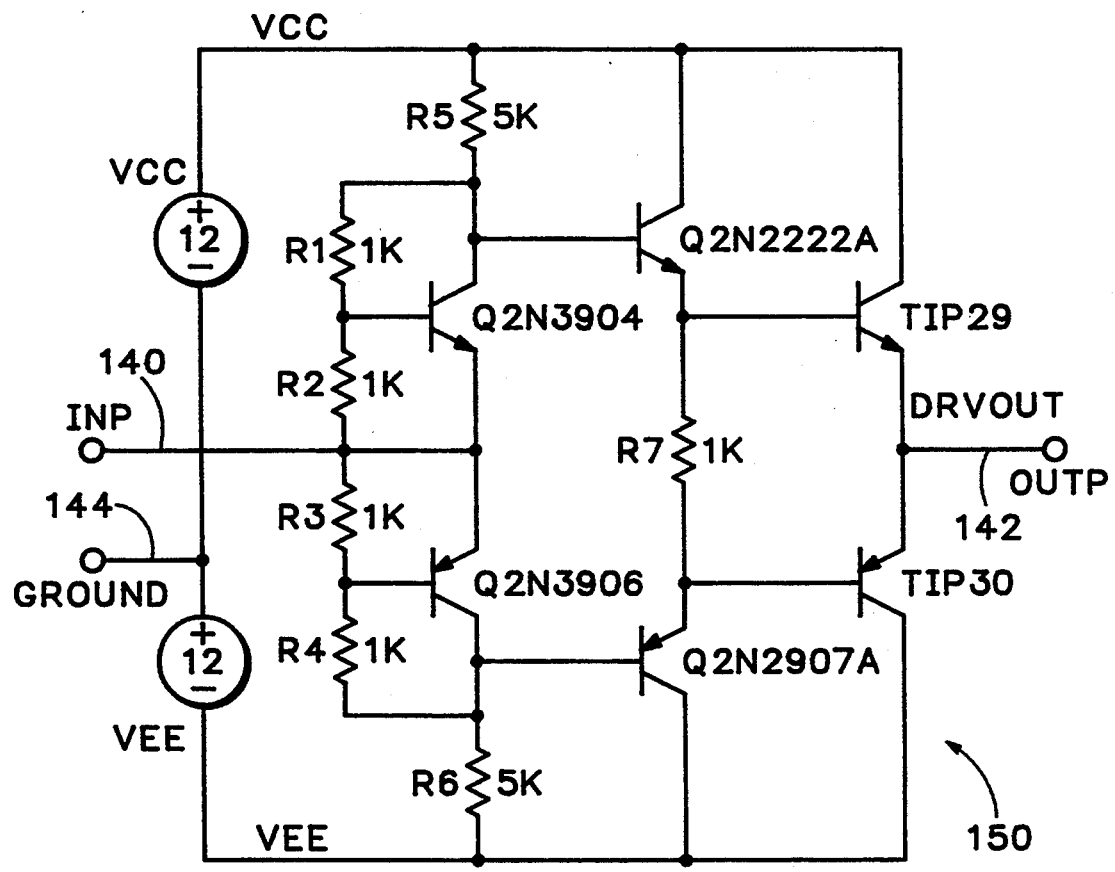
FIG. 5 is a modified motor drive which is derived from the clipper device of FIG. 4.

Clipper model 134a may be further modified by creating a symbol for the motor drive, such as motdriv2 by further defining the components of clipper 134a in terms of physical elements. Such a modified motor drive is depicted generally at 150 in FIG. 5. Motor drive 150 may be seen to include a number of transistors, resistors and voltage sources, which may be manipulated to achieve a desired end result. It should be appreciated that the figure contains values and identification numbers which are for purposes of illustration only.

Clipper 134a may now be replaced with the motor drive symbol 150, which may have the internal components thereof changed and otherwise manipulated during the course of simulation in order to achieve a desired result. As previously noted, as modifications are made to system 120, it is necessary to generate a new netlist and then to run a new simulation. As noted earlier herein, the particular example uses an H(s) model, which is representative of an S-domain rational polynomial model, as described in connection with FIG. 1, blocks 32–44. Other types of models have been previously described herein. The next section will deal with specifics of model selection and graphical modeling using specific models.

Graphical Modeling

Graphical modeling, as used herein, is a means for defining behavior of blocks within a system or circuit, which, as the system or circuit is being conceptualized may not contain full details necessary to implement a physical representation of the system. Graphical modeling provides support for defining the behavior and the performance requirements in all three levels, control, sample data, and physical systems, of design and construction. Graphical modeling also assists a system designer in defining a necessary component of a system in terms of function of the component without requiring the designer to define the physical component prior to deciding what its function should be.

Graphical modeling provides a technique of creating a behavior definition of a model, which is representative of a real-world device. The behavior definition may then be used to generate an implementation of the model using an analog hardware description language, such as MAST ®. A significant advantage of graphical modeling is that graphical modeling provides a more immediate and straightforward way of defining behavior than is available using a hardware description language. The model definitions which are created using graphical modeling are done by modifying properties on symbols instead of creating a programming language description. The definition which is created may be as accurate or as ideal as desired. For instance, early in the design process, the definition may be more ideal because the user is dealing with high-level concepts. As the design becomes more refined, more information may be provided, such as poles, or zeros, nonlinear behavior, etc. An example has been previously provided wherein a nonlinear model was first defined as a clipper, then more precisely defined as a motor drive.

In conventional system simulators, a macromodel may be created by connecting existing models together and then modifying the characteristics such that the overall macromodel performs the desired function. A limitation of macromodeling is that the behavior which is specified is limited to the models which have been predefined, and the behavior may be modified as a result of undesired characteristics of the selected models which compose the macromodel. Another limitation is that the user must have a full understanding of the internal architecture of the block which is being modeled in order to generate an acceptable model. However, during the conceptual phase of design, this level of information may not yet be available.

Graphical modeling, on the other hand, allows a user to implement a system without understanding the topology or implementation of the block which is being modeled, and without the concern about unwanted side effects of existing models. The precise, desired behavior may be modeled and defined using a graphical model.

At this point, it is necessary to distinguish between control systems, Z-domain systems and physical systems. A control system model has the characteristic that signals flow in a single direction. A model has one or more inputs and may have one or more outputs. There are no inherent conservation laws that must be obeyed because each model is considered isolated from the next, except for the ability to receive and generate a signal. The signal which is generated for control system models have units of input nu, output nu. These signals are analog in nature and may be used with all templates which are available in a control system template library. In order to connect a control system signal to an .electrical component, or to a physical system, a signal converter model, or behavior block, which translates the signal into an electrical impedance, must be used.

A Z-domain system, or sample data system model, is similar to the control system model and that it also handles signal flow. Its signals, however, have units of state nu. These signals are event-driven in nature, and may be used with all of the other templates available in a sample data system template library. Like the control system signals, in order to connect these Z-domain signals to electrical components or other physical systems, a signal converter model which translates the signal into an electrical impedance and an analog signal must be used.

A physical system model is one in which a set of physical conservation laws is obeyed. The most common physical system which is generally translated and simulated is the electrical system. However, other types of physical systems, including mechanical, thermal, rotational, translational, hydraulic and optical may also be defined.

The translator of the invention may generate a graphical model in at least two different ways. The first method is to generate a graphical model from an existing set of symbols contained irt symbol library 26 by assigning properties, or quantitative values, to the symbol. This is generally how a control system rational polynomial and nonlinear model are defined. The advantage of this method is that the behavior may be defined with the simple addition of properties to an assembled system. A disadvantage is, however, is that the model which is generated is only available for a one-time use and cannot be used in other portions of the current or other designs.

A second way to create a graphical model is to create a new symbol with the appropriate properties, including a new behavior. In this way, a model of a realworld component may be generated. Additionally, the symbol representing the graphical model may be customized by the user. Once the new symbol is generated, it may be used as many times in the design or in other designs as desired.

The following will discuss the various types of models and describe conditions under which it is, appropriate to use the models.

S-Domain Rational Polynomial Model

Figure 6:
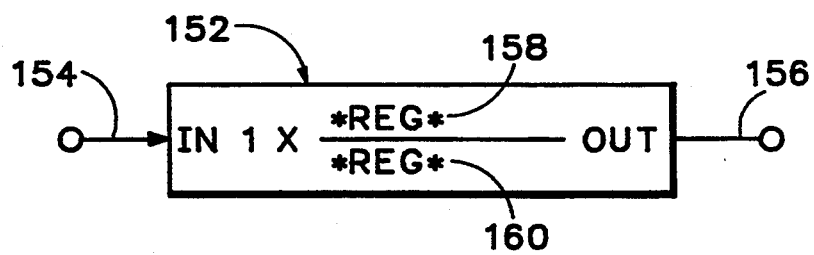
FIG. 6 is an S-domain rational polynomial model for a control system.

The S-domain rational polynomial control system model is used when it is desired to model a control system block whose linear frequency behavior is to be defined in terms of a rational polynomial in S. This allows the user to specify the behavior directly in terms of either a sum or product formulation, and to use algebraic expressions instead of a list of coefficients, which is believed to make the function easier to understand. A preferred embodiment of the graphical model symbol for a control system is depicted at 152 in FIG. 6. Model 152 has an input 154, an output 156, and its operation is defined in terms of a numerator 158 and a denominator 160. The symbol properties, in the preferred embodiment, include:

| Property | Value |
| --- | --- |
| gain: | 1 |
| numerator: | *req* |
| denominator: | *req* |
| input: | in |
| output: | out |

Gain, in this model, is a property which specifies the gain of a transfer function. A default value of "1" is provided. The numerator and denominator properties specify the algebraic expression in S for the numerator and denominator of the transfer function. The default *req* means that a value is required, and must be provided before the model may be used.

The rational polynomial model may also be used for electrical or physical systems. This model, depicted in FIG. 7, is used when a user requires an electrical or physical system block whose linear frequency behavior is to be defined in terms of a rational polynomial in S. This allows the user to specify the behavior directly in terms of either a sum or a product formulation. The function is believed to be easier to understand when the algebraic expressions are used instead of a list of coefficients.

In the preferred embodiment, there are four different configurations provided for this type of model. This is because the physical systems have two types of quantities which define the system operation, i.e., electric systems can have voltage-to-voltage, voltage-to-current, current-to-current and current-to-voltage models. The symbols for this graphical rnodel are depicted in FIGS. 7a, 7b, 7c and 7d, respectively.

Properties which are required to exist in the symbol for an electric or physical system are similar to those for the control system rational polynomial model generator. The differences are due to the need to define the branches in the electrical or physical behavior of the connection. The required properties for the physical polynomial generator are as follows:

| Property | Value |
| --- | --- |
| gain: | 1 |
| numerator: | *req* |
| denominator: | *req* |
| branch1: | vin = v(inp,inm),iin = i(inp->inm) |
| branch2: | vout = v(outp,outm),iout = i(outp->outm) |
| eq1: | iin=0 |
| input: | vin |
| output: | vout |

The gain of the transfer function has a default value of one. As with the control system model, the value of *req* entry means that the value is required and must be provided before the model may be used.

All normal algebraic operations are allowed for constants and expressions in S. The only restriction on S is that it can only appear as a non-negative power of S. 1/S is not allowed. There are no restrictions on the degree of the polynomial that may be specified.

The branch1 and branch2 properties are used to define the electrical branches for the model. The eq1 property is used to define the type of input for the model. A value of vin=0 means that the input has zero resistance and is a short. A value of iin=0 means that the input has infinite resistance and is an open. The input and output properties are used to tell the generator which branch quantities are used for the input and output of the transfer function. The value of the input property must agree with the eq1 property in that a value of iin means that eq1 must have a value of vin=0, while vin means that eq1 must have a value of iin=0.

Referring to FIG. 7a, which is a representation of a voltage-to-voltage model, model 162 has a positive input 164, a negative input 166, a positive output 168, and a negative output 170. As with the control system models, a numerator 172 and a denominator 174 are also provided. FIG. 7b depicts a model 176, which is a voltage-to-current model 180 and includes a current output 178. FIG. 7c is a current-to-current model and includes a current input 182 and a current output 178. FIG. 7d is a current-to-voltage model 184.

Z-Domain Rational Polynomial Model

Referring now to FIG. 8, a Z-domain rational polynomial model is depicted at 186. The Z-domain rational polynomial model H(z) is used when a sampled data system block whose behavior is defined in terms of a rational polynomial frequency behavior in terms of Z is used. This type of model allows the user to specify the behavior directly in terms of either a sum or a product formulation. The Z-domain graphical models differ from the control and physical system graphical models in that the model generator does not generate a new template for this type of graphical model. The model generator provides a more natural interface to the existing templates than is possible with a hardware description language.

Z-domain model 186 includes an input port 188, an output port 190, a numerator block 192 and a denominator block 194. Additionally, the Z-domain graphical model has an extra port 196 that is used to connect to the sampling clock, referred to herein as a clock port. The properties which are included in the symbol for the Z-domain model include:

| Property | Value |
| --- | --- |
| gain: | 1 |
| numerator: | *req* |
| denominator: | *req* |
| input: | xin |
| output: | xout |

As with previously defined models, the gain property specifies the gain of the transfer function. It is provided with the default value of "1". The numerator and denominator properties specify the algebraic expressions in Z for the numerator and denominator of the transfer function. The values are required and must be provided for the model to be used. All normal algebraic operations are allowed for constants and expressions in Z with the only restriction on Z being that it can only appear as a negative power of Z. $Z^2$ is not allowed. The input and output properties specify the port names that are used for the input and output of the rational polynomials.

S-Domain Pole/Zero Model

The S-domain pole/zero model may be used with either the control system or with a physical/electrical system. For the control system, the S-domain pole/zero control system graphical model is used when a control system block is present and whose behavior is defined in term of poles and zeros of the frequency response. This allows the user to specify the behavior in terms of a list of poles and a list of zeros instead of as a transfer function in S. A pole/zero model for a control system is depicted at 198 in FIG. 9.

The properties for this model are:

| Property | Value |
| --- | --- |
| gain: | 1 |
| representation: | *opt* |
| poles: | *req* |
| zeros: | *req* |
| input: | in |
| output: | out |

The representation property may be expressed as rectangular, polar, quality or damping. The *opt* indicates that this is an optional entry. As with previous models, the gain property specifies the gain of the transfer function and is provided with a default value of "1". The representation property specifies the way in which the poles or zeros are represented. In the preferred embodiment, the default is rectangular, which indicates that the poles and zeros are being entered as complex-conjugate pairs. Both members of a pair need to be entered. For instance, the entry:

(1,−2),(1,2)

represents the equation:

$(s-(1-2j))*(s-(1+2j))$, or, $s^2-2s+5$.

The pole/zero model for a control system includes a single input 200 and a single output 202.

The user may enter a single pole on a real axis using rectangular representation by specifying a single entry with a zero imaginary component, as in:

(5,0),(1,−2),(1,2)

which is representative of:

$(s-5)*(s-(1-2j))*(s-(1+2j))$, or $(s-5)*(s^2-2s+5)$, or $s^3-7s^2+15s-25$

It should be noted that poles and zeros are represented using standard mathematical convention.

A representation value of polar means that the pair of numbers which are entered for poles and zeros represent magnitude and phase, where phase is in degrees. Polar representations are also provided as complex conjugate pair of poles or zeros.

A representation value of quality indicates that a pair of numbers which are entered represent frequency ($2\pi f$) and a quality factor (Q), which generates the following polynomial:

$s^2+(\omega/Q)s+\omega^2$, where $\omega=2\pi f$.

For example, the representation:

(0.1, 0.2)

is equivalent to the expression:

$s^2+((2\pi*0.1)/0.2)s+(2\pi*0.1)^2$.

The value Q may also be specified using inf to indicate an infinite Q.

A representation value of damping means that the pair of numbers are entered in frequency and damping factor ($\zeta$) with the following polynomial being generated:

$s^2+2\omega\zeta s+\omega^2$, where $\omega=2\pi f$.

For example, an entry of:

(0.1, 0.2)

is equivalent to $s^2+2(2\pi*0.1)*0.2*s+(2\pi*0.1)^2$.

The pole and zero properties are lists of the poles and zeros with the values being interpreted as specified by the representation property. It is also possible to specify an explicit representation by adding one of the letters representing the representation type before any or all parenthesis on pole or zero. For instance, with the value of representation set to quality, the following represents a real root at one and a conjugate pair specified as a Q factor:

r(1,0),(1,2).

Obviously, if the conjugate pairs are specified using different representations, the correct polynomials cannot be gene, rated, the input and output properties specified the port names which are used for the input and output of the rational polynomial.

The S-domain pole/zero model may also be used for electrical or physical systems when an electrical or physical system block is present and the user wishes to define the behavior of the block in terms of poles and zeros of the frequency response. This eliminates the need to specify the behavior as a transfer function in S and allows the user to specify the behavior in terms of a list of poles and a list of zeros.

Figure 10:
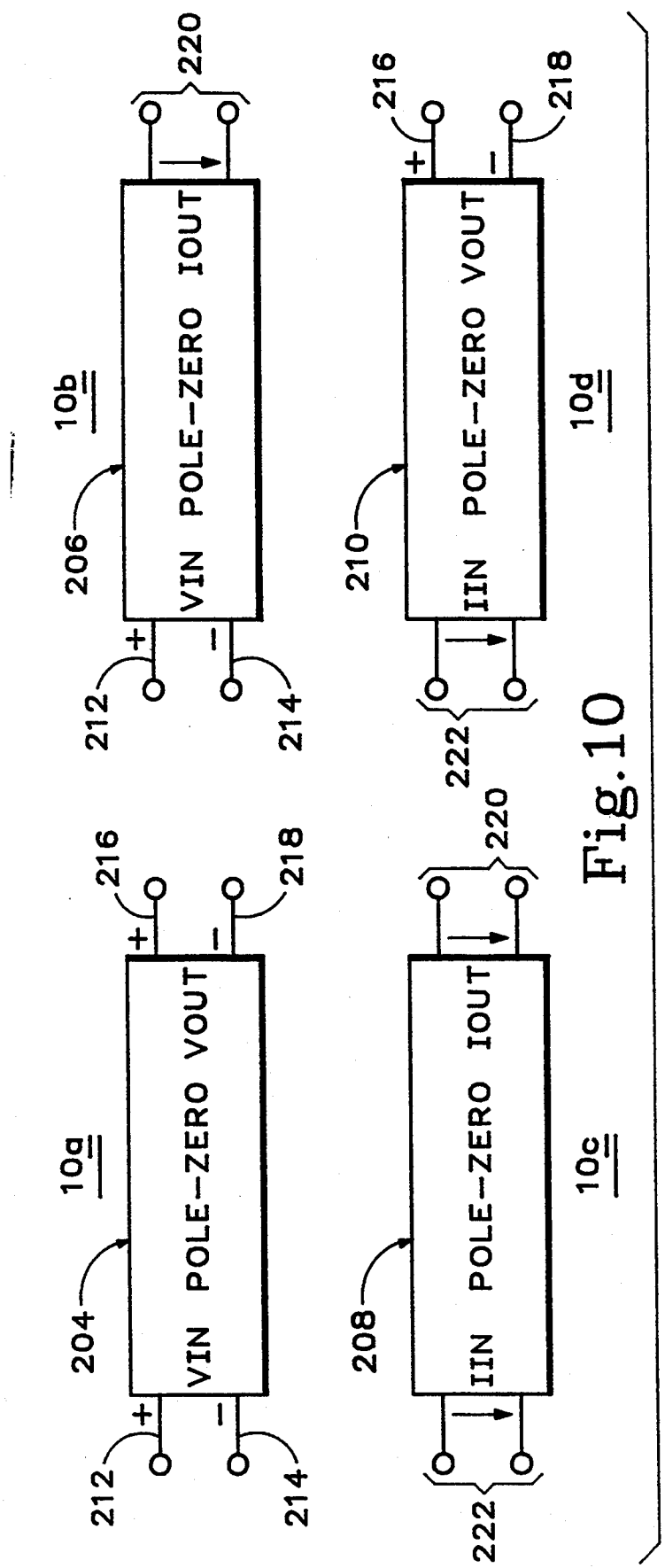
FIG. 10 is an S-domain pole/zero model for a physical system.

Graphical models for an electrical or physical system block and a S-domain pole/zero are depicted in FIG. 10, with FIG. 10a containing a model 204, which is representative of a voltage-to-voltage block, model 206 in FIG. 10b which is representative of a voltage-to-current block, model 208 in FIG. 10c, which is representative of a current-to-current block, and model 210 in FIG. 10d which is representative of a current-to-voltage block. Blocks 204, 206, 208 and 210 include, where indicated, a positive voltage input 212, a negative voltage input 214, a positive voltage output 216 and negative voltage output 218. Additionally, a current output 220 and a current input 222 are provided.

Properties for electrical and physical system S-domain pole/zero models include:

| Property | Value |
| --- | --- |
| gain: | 1 |
| representation: | *opt* |
| poles: | *req* |
| zeros: | *req* |
| branch1: | vin = v(inp,inm),iin = i(inp->inm) |
| branch2: | vout = v(outp,outm), |
|  | iout = i(outp->outm) |
| eq1: | iin=0 |
| input: | vin |
| output: | vout |

The properties for the electrical and physical systems are the same as those for the control systems with the addition of the branch and eq1 properties, and changes to the input and output symbols. As with previous models, branch1 and branch2 properties define the electrical branches for the model while the eq1 property is used to define the type of input for the model.

Z-Domain Pole/Zero Model

Figure 11:
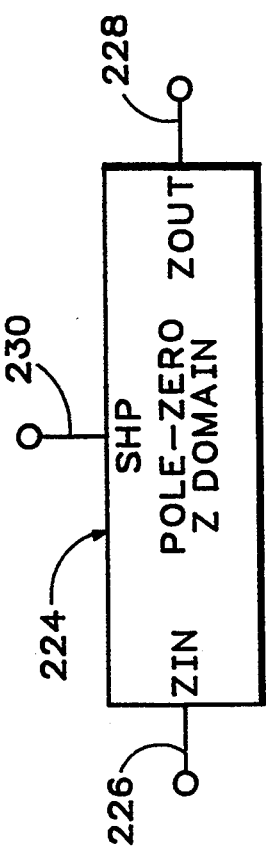
FIG. 11 is a Z-domain pole/zero model for a control system.

A Z-domain pole/zero model PZ(z) provides a model for a sampled data system which is used when a sampled data system block is present and the behavior of the block is defined in terms of poles and zeros of the Z-domain response. This allows the user to specify the behavior in terms of a list of poles and a list of zeros instead of as a transfer function in Z. Such a model is depicted in FIG. 11 at 224 and includes an input 226, an output 228 and a port 230 which may be connected to the sampling clock. As with other Z-domain models, the model generator does not generate a new template for the graphical model, which is used, instead, to provide a more natural interface to the existing templates than is possible using a hardware description language.

The symbol properties required for this model generator are:

| Property | Value |
| --- | --- |
| gain: | 1 |
| representation: | *opt* |
| poles: | *req* |
| zeros: | *req* |
| input: | zin |
| output: | zout |

The gain, as usual, specifies the gain of the transfer function. The representation property specifies the format of the poles/zero which is entered. The default is rectangular, but may also be expressed in terms of polar coordinates. A rectangular property indicates the poles and zeros are entered as complex-conjugate pairs, and, once entered, the property is converted to a polynomial in the following form:

$$1 - 2(\text{real part})z^{-1} + (\text{magnitude})^2 z^{-2}.$$

When using either member of the complex conjugate pair, $$(\text{magnitude})^2 = (\text{real part})^2 + (\text{imaginary part})^2.$$

For example, the entry:

$$(1,-2),(1,2)$$

represents:

$$1 - 2(1)z^{-1} + 5z^{-2}.$$

A representation value of polar indicates that the pair of numbers which are entered for poles and zero represent magnitude and phase, where phase is in degrees. These are also entered as complex conjugate pairs of poles and zeros and is converted to the proceeding format by finding the real part from the polar form.

Nonlinear Models

Figure 12:
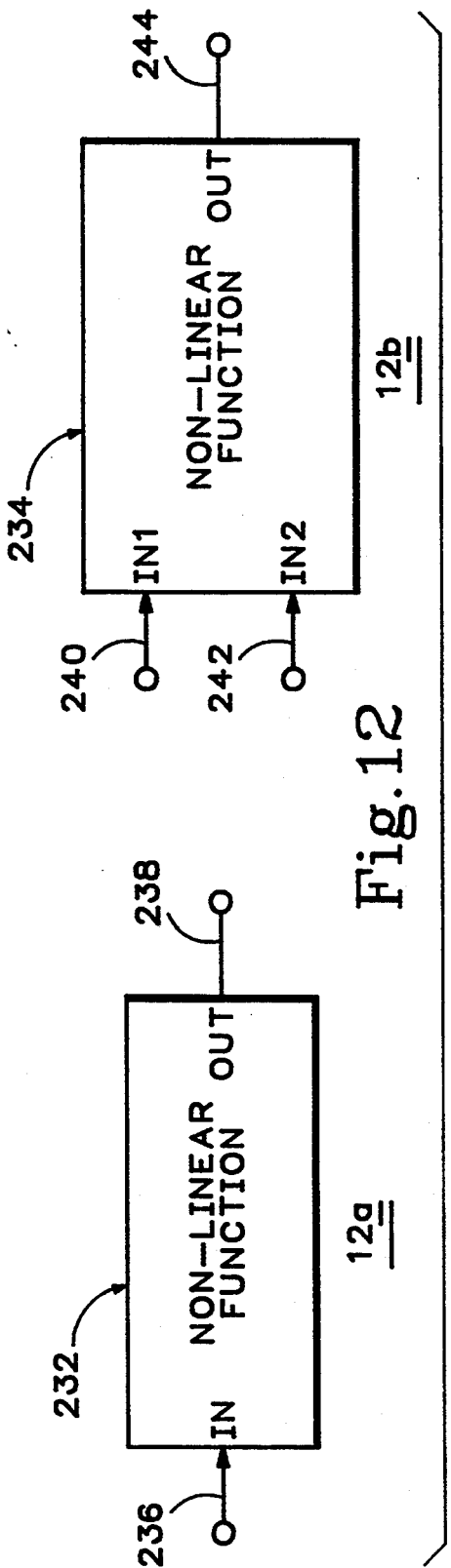
FIG. 12 is a nonlinear model for a control system.

Nonlinear models are provided in one-input and two-input versions for use with control systems. Such non-linear models are depicted in FIG. 12, with the one-input model being shown in FIG. 12a at 232, and the two-input model being depicted in FIG. 12b at 234.

Referring now to model 232 in FIG. 12a, the following symbol properties are provided for this model generator:

| Property | Value |
|---|---|
| primitive: | *req* |
| ref: | *req* |
| eq1-eqn: | *opt* |

Sample properties for a single input nonlinear model may define the primitive as deadbnd, the reference (ref) may be referred to as arbfun1 and eq1 may be defined as:

out = if in < −10 then 25* (in+10) else if in > 10 then 25* (in−10) else 0, which will describe a nonlinear function of the type depicted in FIG. 3 at 132.

The value of the eq1 property in the example is a mathematical expression for a "deadband" control system function. The equation is a conditional expression that returns a value depending on which of the state of conditions is true. This is an example of the MAST® modeling language.

The eq1 through eqn properties specify the mathematical equations which are entered to describe the general behavior of a nonlinear, one-input device. There may be as many of these properties as are required to describe the behavior. The properties are evaluated in numerical order even if they are out of order in the list of properties as provided by the user. Any properties that are assigned *opt* are ignored in the creation of the graphical models and are defined using standard graphical modeling MAST® syntax, using the port names for the variables in the equations. For example:

| | |
|---|---|
| out = if in < −12 then −12 else if in > 12 then 12 else in | eq1 |
| out = (10*in)**2 | eq2 |
| out = in12 + in23 | eq3 | make d_by_dt(out) = in

The nonlinear function depicted at 232 has a single input 236 and a single output 238.

Referring now to FIG. 12b, nonlinear function 234 includes a pair of inputs 240, 242 and a single output 244.

The single input nonlinear function control system graphical model is used to define a control system block whose behavior is defined in terms of a nonlinear algebraic and differential equation, or in terms of an event-driven state behavior in time. This allows the user to specify the behavior in terms of ordinary algebraic and differential equations or event-driven logical equations.

Figure 13:
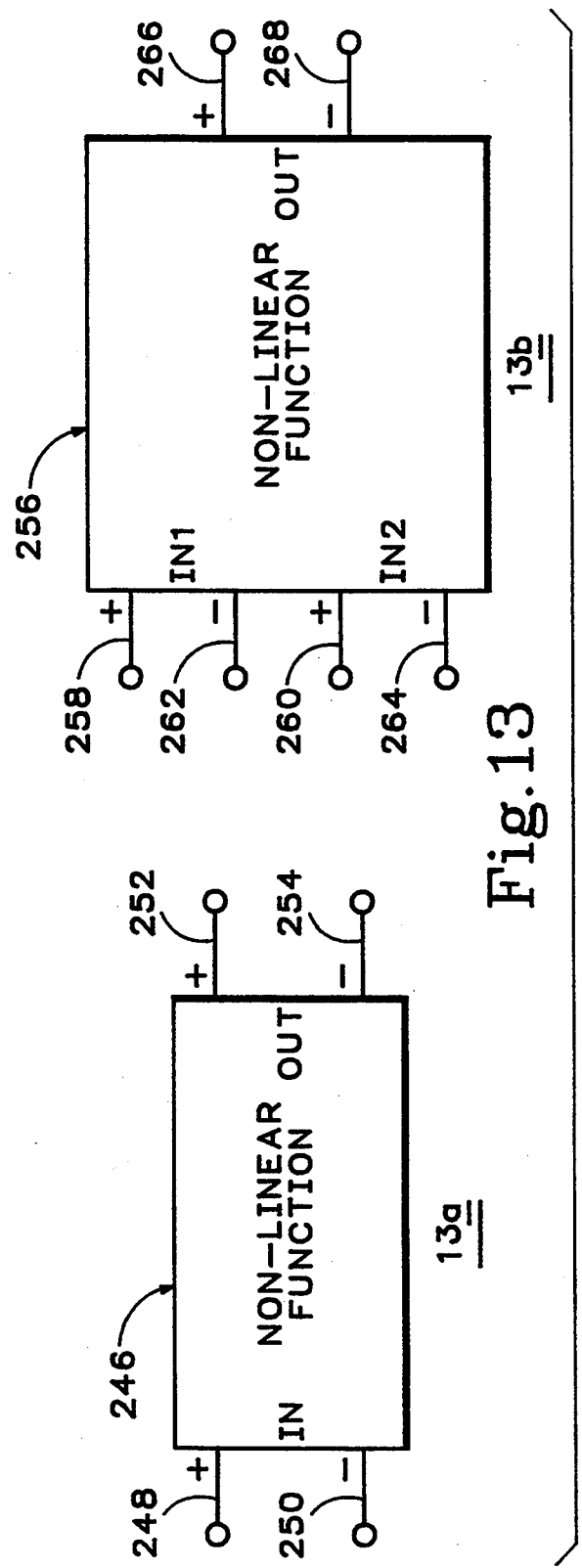
FIG. 13 is a nonlinear model for a physical system.

Multiple input nonlinear graphical model function blocks for physical systems are used to define a physical system block whose behavior is stated in terms of a nonlinear algebraic or differential equation or event-driven state behavior in time, which allows the user to specify behavior in terms of an ordinary algebraic or differential equation or event-driven logical equation. Such blocks are depicted in FIG. 13, which shows nonlinear models fox use with electrical or physical systems. Model 246, shown in FIG. 13a, provides a single, positive, 248 and a single negative, 250, input, and single, positive, 252, and a single negative, 254, output.

FIG. 13b depicts a nonlinear function for an electrical or physical system at 256 which provides multiple, positive inputs 258, 260, and multiple negative inputs 262, 264, while providing a single positive output 266 and a single negative output 268. The properties for nonlinear models for electrical or physical systems include:
primitive:
ref:
eq1-eqn:
branch1:
branch2:

The following are examples of properties and values for nonlinear, one input models for electrical and physical systems:

| Property | Value |
|---|---|
| primitive: | clipper |
| ref: | arbfun2 |
| eq1: | iin = 0 |
| eq2: | vout = if vin < −12 then −12 else if vin > 12 then 12 else vin. |

For the multiple input nonlinear functions, branch1 and branch2 may be defined as follows:

| Property | Value |
|---|---|
| branch1: | vin = v(inp,inm), iin = i(inp->inm) |
| branch2: | vout = v(outp,outm), iout = i(outp->outm) |
| eq1: | *opt* |
| eq2: | *opt* |
| eq3: | *opt* |

The branch1 and branch2 properties define the electrical branches for the model.

New symbols, however, may be created which more accurately represent the behavior of the model which is being created. For example, a MOSFET may be created having a three-terminal symbol. If a new symbol has ports which are different from those of the original model, the branch equations for the new ports should be modified, as should the characteristics. For example, for the MOSFET example, with a gate, drain, and source ports, the following branches may be defined:

vgs=v(gate,source),igs =i(gate->source)          branch1 vds=v(drain,source),ids=i(drain->source)          branch2 vgd=v(gate,drain),igd=i(gate->drain)              branch2

If the physical system type needs to be changed, then the branch equations also need to be redefined in terms of the new physical system.

The eq1 through eqn properties specify the mathematical equations which are entered to describe the block's behavior. There may be as many of these properties as are needed to describe the behavior. For example, an ideal MOSFET, with constant gate capacities, may be modeled using the previous branch examples and the following equations:

vt=0; k=1; gmin=1 p                              eq1 cgs=0.1 p                                        eq2 cgd=0.1 p                                        eq3 vgsp=if vds>0 then vgs else vgd                  eq4 vdsp=if vds>0 then vds else -vds                 eq5 region1=k*(vgsp-vt-vdsp/2)*vds                   eq6 temp1=(k/2)*(vgsp-vt)**2                         eq7 region2=if vds>=0 then temp1 else-temp1          eq8 igs=d_by_dt(cgs*vgs)                             eq9 igd=d_by_dt(cgd*vgd)                             eq10 ids=(if vgs<=vt then 0 else if vdsp<vgsp-vt then
    region1 else region2)+gmin*vdsp              eq11

Referring now to FIG. 14, a frequency response graphical model for a control system is depicted generally at 270. This model includes a single input 272 and a single output 274. The frequency response, 276 is defined within the model. This frequency response model may be used with control systems and is used when data is available describing the frequency response of a system which has a behavior which is to be modeled in terms of a rational polynomial transfer function, H(s). The transfer function H(s) will approximate the specified frequency response in the given frequency range defined by:

$$H(s) = \frac{\Sigma(b(i) \cdot s^i)}{\Sigma(a(i) \cdot s^i)}$$

where "a" is the vector of denominator coefficients and "b" is the vector of numerator coefficients of the s domain polynomial.

This frequency response data may have resulted, for example, from a system simulation of a large system that the user now desires to reduce to a single transfer function in order to optimize the speed of further simulations. Alternatively, the frequency response data may have been obtained by measurements of a "black box" by an instrument such as a spectrum analyzer. In the latter case, the data must first be converted to a plot file (pfile) format before it may be used as a input to the frequency response model.

The properties for model 270 are specified, for a control system, as follows:

| Property | Value |
|---|---|
| gain: | 1 |
| numerator_degree: | *req* |
| denominator_degree: | *req* |
| control_points: | *opt* |
| representation: | *opt* |
| plot_filename: | *opt* |
| signal_name: | *opt* |

The gain property specifies the gain of the transfer function and has a default value of 1. The numerator_degree and denominator_degree properties are used to specify estimates for the degree of the numerator and denominator polynomials. Values must be entered for these properties. The control_points property is used to specify series of points describing the signal from which the transfer function is to be derived. Each point is described by three values, separated by commas, and enclosed in parenthesis. These three values are interpreted according to the value of the representation property. For example, if the representation property is specified as degrees, the values of the control_points property would take the form:

(f1,m1,deg1),(f2,m2,deg2),(f3,m3,deg3), . . .

where f1, f2 and f3 are frequencies, m1, m2 and m3 are magnitudes, and deg1, deg2 and deg3 are phases in degrees. The control_points property is used to specify the response in the signal when a plot_filename has not been specified. The control_points property should not be given a value if a value has been specified for the plot_filename property.

The value of the representation property determines how the values of the control_points property are to be interpreted. The representation property may be given the following values, with the associated values for the control_points.

| representation property | control_points |
|---|---|
| degree | frequency, magnitude, degrees |
| complex | frequency, real, imaginary |
| db_degree | frequency, magnitude in db, degrees |
| radian | frequency, magnitude, radians |

-continued

| representation property | control_points |
|---|---|
| db_radian | frequency, magnitude in db, radians |

The plot_filename property specifies a plot file containing data points to be used to determine the frequency response of the model. The plot file must be in the designated pfile format. The plot_filename property should not be given a value if a value has already been specified for the control_points property. The signal_name property is used to indicate a particular signal in the plot file specified by the plot_filename property. If no signal_name is given, the first signal in the plot file will be used.

Although the use of the frequency response model is a powerful feature of the translator of the invention, there are some limitations of which a user must be aware. For instance, if a signal is not provided, either by a plot file or by series of points specified by the control_points property, a serious error will occur. Additionally, if the resulting transfer function is not stable, an error message will be provided. In the latter case, however, a netlist will be created and a simulation completed as best possible.

Turning now to FIG. 15, a frequency response model is depicted which is intended for use with electrical or physical systems. Model 278 in FIG. 15a represents a voltage-to-voltage model having a positive input 286, a negative input 288, a positive output 290 and a negative output 292. Model 280 in FIG. 15b includes the positive and negative inputs and a current output 294, and is representative of a voltage-to-current model. Model 282 in FIG. 1.5c is representative of a current-to-current transfer function and includes a current input 296 and a current output 294. Finally, model 284 in FIG. 15d is representative of a current-to-voltage transfer function and includes a current input 296, a positive output 290 and a negative output 292. The properties for such a model are:

| Property | Value |
|---|---|
| gain: | 1 |
| input: | iin |
| output: | iout |
| branch1: | vin = v(inp,inm),iin = i(inp->inm) |
| branch2: | vout = v(outp,outm),iout = i(outp->outm) |
| eq1: | vin=0 |
| numerator_degree: | *req* |
| denominator_degree: | *req* |
| control_points: | *opt* |
| representation: | *opt* |
| plot_filename: | *opt* |
| signal_name: | *opt* |

As with the control system model, the gain property specifies the gain of the transfer function and has a default value of "1". The input and output property specify which branch quantities are to be used for the input and the output of the transfer function. In the example given above, the transfer function will represent the current gain of the system $i_{in}/i_{out}$. The branch1 and branch2 properties define electrical branch equations for the models. The eq1 property is used to define the type of input for the model. A value of vin=$\phi$ means that the input has a $\phi$ resistance and is a short. A value of iin=$\phi$ means that the input has infinite resistance and is an open. The numerator_degree and denominator_degree properties are used to specify estimates for the degree of the numerator and denominator polynomials. Values for these properties must be specified. The control_point property is used to specify a series of points describing the signal from which the transfer function is derived. Each point is described by three values and is interpreted according to the value of the representation property, as set forth in connection with the previous model. Similar limitations are present with the electrical or physical systems model as are present with the control system model.

Synthesis of Master Files

Each model generator 44, 52 has associated with it a master file which instructs the model synthesis module 42, 54 as to the format of the generated model. The name of the file is determined by appending a "mstr" suffix to the value of the model generator property. The master files for the supported model generator properties of hins (H(s) for S polynomial), pzins (H(s) for s pole/zero), arbfun (F(x) for arbitrary nonlinear function), hinz (H(z) for z polynomial), and pzinz (H(z) for z pole/zero) are hins.mstr, pzins.mstr, arbfun.mstr, hinz.mstr, and pzinz.mstr, respectively. The contents of each of these files for the HDL MAST® are given below.

The model synthesis master file for symbols with a model generator property of "hins" have the following contents in the file hins.mstr:

```
element template $(primitive) $(pin_list)
    $(pin_decl+)
{
    $(branch*)
    $(eq*)
    $(output) = transfer_function($(gain) *    (input),
                                              [$(num_coefficients)],
                                              [$(den_coefficients)])
}
```

Similarly, the model synthesis master file for symbols with a model generator property of "pzins" have the following contents in the file pzins.mstr:

```
element template $(primitive) $(pin__list)
    $(pin__decl+)
{
    $(branch*)
    $(eq*)
    $(output) = transfer__function($(gain) *    $(input),
                                                [$(num__coefficients)],
                                                [$(den__coefficients)])
}
```

The model synthesis master file for symbols with a model generator property of "arbfun" have the following contents in the file arbfun.mstr:

```
element template $(primitive) $(pin__list)
    $(pin__decl+)
{
    $(branch*)
    $(eq+)
}
```

The model synthesis master file for symbols with a model generator property of "hinz" have the following contents in the file hinz.mstr:

```
zlti.$(ref)$(pin__map) = a = 1,
num = [$(num__coefficients)],
    den = [$(den__coefficients)], p = 0
```

Similarly, the model synthesis master file for symbols with a model generator property of "pzinz" have the following contents in the file pzinz.mstr:

```
zlti.$(ref)$(pin__map) = a = 1,
num = [$(num__coefficients)],
    den = [$(den__coefficients)], p = 0
```

Interpretation of Master Files

All characters not surrounded by $() are interpreted as literal characters to be written as is to the generated model. Characters within $() are interpreted as the name of a symbol property or an internal synthesizer property which has been derived from symbol properties.

When an $() surrounded string is encountered, the properties for the current symbol are searched to see if such a property exists. If it does, then the value of that property replaces $() and the characters within. If such a property is not found, the synthesizer internal properties are searched and if a match is found, the value of that property is likewise inserted. If, instead, this search fails, an error message is generated and the synthesis process for the current symbol is aborted.

If the property name within a $() ends in an asterisk(*), it means insert the value of all properties with names matching the characters to the left of the asterisk. In this way a property reference of $(eq*) would insert the values of the properties eq0, eq1, eq2, eq3, and so on.

A trailing plus sign (+) has essentially the same meaning as the trailing asterisk except that an asterisk allows the match of zero or more properties, while the plus sign constrains the match to one or more, otherwise an error is generated.

Synthesis Examples

Referring now to FIGS. 1 and 3, in block 136, referred to earlier herein as ratio1, the properties are set forth as follows:

| Property | Value |
| --- | --- |
| model__generator: | hins |
| primitive: | hins |
| ref: | ratio1 |
| gain: | 1000 |
| numerator: | 5*s+6 |
| denominator: | s**2+1125*s+1200 |
| input: | in |
| output: | out |
| pin__type(in): | input nu |
| pin__type(out): | output nu |

Once these properties are passed through S polynomial translator 36, the following derived properties are computed:

| Property | Value |
| --- | --- |
| pin__list: | in out |
| pin__decl(in): | input nu in |
| pin__decl(out): | output nu out |
| num__coefficients: | 5, 6 |
| den__coefficients: | 1, 1125, 1200 |

When these two sets of properties are substituted into the hins.mstr file, the following model is synthesized, which is placed in the file hins.sin:

```
element template hins in out
    input nu in
    output nu out
{
    out = transfer__function(1000 * in, [5, 6], [1, 1125, 1200])
}
```

Similarly, block 132, referred to earlier herein as deadbnd, has properties set forth as follows:

| Property | Value |
| --- | --- |
| model__generator: | arbfun |
| primitive: | deadbnd |
| ref: | arbfun1 |
| eq1: | ut = if in < −10 then 25*(in+10) else if in > 10 then 25*(in−10) else 0 |
| input: | in |
| output: | out |

| Property | Value |
| --- | --- |
| pin_type(in): | input nu |
| pin_type(out): | output nu |

Once these properties are passed through the arbitrary nonlinear function translator 46, the following derived properties are computed:

| Property | Value |
| --- | --- |
| pin_list: | in out |
| pin_decl(in): | input nu in |
| pin_decl(out): | output nu out |

```
element template in out
    input nu in
    output nu out
{
    out = if in < −10 then 25*(in+10) else if in > 10 then 25*(in−10) else 0
}
```

Similarly, block 134, referred to as arbfun2, has properties set forth as follows:

| Property | Value |
| --- | --- |
| model_generator: | arbfun |
| primitive: | clipper |
| ref: | arbfun2 |
| eq1: | iin = 0 |
| eq2: | vout = if vin < −12 then −12 else if vin > 12 else vin |
| input: | in |
| output: | out |
| pin_type(p): | electrical |
| pin_type(m): | electrical |

Once these properties are passed through the arbitrary nonlinear function translator 46, the following derived properties are computed:

| Property | Value |
| --- | --- |
| pin_list: | p m |

| Property | Value |
| --- | --- |
| pin_decl(p): | electrical p |
| pin_decl(m): | electrical m |

When these two sets of properties are substituted into the arbfun.mstr file, the following model is synthesized, which is placed in the file clipper.sin:

```
element template in out
    input nu in
    output nu out
{
    out = if in < −10 then 25*(in+10) else if in > 10 then 25*(in−10) else 0
}
```

Netlist Generation

After all of the graphical models for the schematic have been synthesized, the following netlist is produced by module 62, FIG. 2A.

Saber netlist for design motcont

Created by the Netlister Toolkit XXX.X of Analogy, Inc.
Created on DDD MMM dd HH:MM:SS YYYY
written template clipper
written template deadbnd
written template hins
Instances found in the top level of design motcont

| Property | Value |
| --- | --- |
| clipper.arbfun2 inm: | 0 inp:drv_in outm:0 outp:drv_out |
| deadbnd.arbfun1 out: | vel_cntrl in:shaft_vel |
| hins.ratio1 out: | leadlag_out in:error |
| var2elec.@"var2elec#5"in: | c_out m:0 p:drv_in |
| dcmotor.motor1 m: | 0 p:drv_out w:shaft_vel = 1=10m, kt=2, j=0.5, r=1, ke=0.2, units=si, d=0.2 |
| integ.integ1 out: | theta in:shaft_vel = k=1 |
| sum.diff2 out: | c_out in1:leadlag_out in2:vel_cntrl = k2=−1, k1=1 |
| sum.diff1 out: | error in1:cmd in2:theta = k2=−1, k1=1 |
| src.vin out: | cmd = ac=(1,0),tran=(pulse=(v1=−5, v2=5, tr=0.1, tf=0.1, |

| Property | Value |
|---|---|
| | td=1, pw=4, per=8)) |

Thus, a behavior modeling translator has been described which is operable to translate the behavior modeling properties of a system into an analog hardware description language. The translator is capable of receiving information in a variety of forms, including in the form of a frequency response, and converting the various forms into the hardware description language.

Although a preferred embodiment of the invention has been described herein, it should be appreciated that further variations and modifications may be made thereto without departing from the scope of the invention as defined in the appended claims.

What we claim is:

1. A general-purpose, computer-implemented translator (10) for translating a specification for a system, having system components, a behavior description for each component, and a template therefor, from an initial representation thereof into another representation of the system comprising:
   a computer-implemented extraction module (30, 32) for extracting behavior descriptions from the specification;
   a computer-implemented analysis module (34) including one or more behavior-specific translators (36, 38, 40, 46, 50, 52) for reducing the behavior description to a mathematical depiction of the components of the system; and
   at least one computer-implemented synthesis module (42, 54) for transforming said mathematical depiction into another representation of the system.

2. The translator of claim 1 wherein said extraction module (30, 32) extracts behavior descriptions from a schematic-capture database (16), which includes a collection of components.

3. The translator of claim 2 which further includes a decision module (68) for determining whether the component properties are expressed in primitive form of the initial representation of the system.

4. The translator of claim 2 which includes a graphical interface module which includes a table forming module for forming a property-value table for each component from the property-value pairs associated with a component.

5. The translator of claim 4 which further includes an error-checking module (90) for examining said property-value table for errors.

6. The translator of claim 1 wherein said analysis module (34) includes a behavior specific normalizer (32b) for determining a specific character of the components from the behavior description thereof from among a predetermined character set for converting the behavior to a simplified normal form.

7. The translator of claim 6 wherein said predetermined character set is taken from the group consisting of:
   a set of nonlinear algebraic and differential equations with respect to time;
   a Laplace transform expressed as the product of rational polynomials in S;
   a Z domain transform expressed as the product of rational polynomials in Z;
   a set of poles and zeros in S representing the roots of the numerator and denominator of the associated transfer function in S;
   a set of poles and zeros in Z representing the roots of the numerator and denominator of the associated transfer function in Z; and
   a frequency response expressed as a list of frequency, magnitude and phase triplets.

8. The translator of claim 1 which further includes
   a collection of component representations (18, 20) in the initial form, each representation including at least one keyword therein;
   a comparison module (32a) to compare the mathematical depiction of the behavior properties of a system component to the other form component representations by matching the properties to said keywords; and
   an output module (62) for outputting an output facsimile for any component which is not linked to said other form representation keyword match by said comparison module (32a).

9. A general-purpose, computer-implemented translator (10) for translating a specification for a physical system, having system components, a behavior description for each component, and a template therefor, from an initial representation thereof into another representation of the system comprising:
   a computer-implemented extraction module (30, 32) for extracting behavior descriptions from the specification;
   a computer-implemented analysis module (34) including one or more behavior-specific translators (36, 38, 40, 46, 50, 52) for reducing the behavior description to a mathematical depiction of the components of the system, wherein said mathematical depiction obeys conservation of physical properties laws; and
   at least one computer-implemented synthesis module (42, 54) for transforming said mathematical depiction into another representation of the system.

10. The translator of claim 9 wherein said extraction module extracts behavior descriptions from a schematic-capture database (16), which includes a collection of components.

11. The translator of claim 10 which further includes a decision module (68) for determining whether the component properties are expressed in primitive form of the initial representation of the system.

12. The translator of claim 11 which includes a graphical interface module which includes a table forming module for forming a property-value table for each component from the property-value pairs associated with a component.

13. The translator of claim 12 which further includes an error-checking module (90) for examining said property-value table for errors.

14. The translator of claim 9 wherein said analysis module (34) includes a behavior specific normalizer (32b) for determining a specific character of the components from the behavior description thereof, from among a predetermined character set and converting; the behavior to a simplified normal form.

15. The translator of claim 14 wherein said predetermined character set is taken from the group consisting of:
- a set of nonlinear algebraic and differential equations with respect to time;
- a Laplace transform expressed as the product of rational polynomials in S;
- a Z domain transform expressed as the product of rational polynomials in Z;
- a set of poles and zeros in S representing the roots of the numerator and denominator of the associated transfer function in S;
- a set of poles and zeros in Z representing the roots of the numerator and denominator of the associated transfer function in Z; and
- a frequency response expressed as a list of frequency, magnitude and phase triplets.

16. The translator of claim 9 which further includes
- a collection (18, 20) of component representations in the initial form, each representation including at least one keyword therein;
- a comparison module (32a) to compare the mathematical depiction of the behavior properties of a system component to the other form component representations by matching the properties to said keywords; and
- an output module (62) for outputting an output facsimile for any component which is not linked to said other form representation keyword match by said comparison module (32a).

17. A general-purpose, computer-implemented translator that operates on a specification for a system, having system components, a behavior description for each component, and a template therefor, for translating the specification from an initial representation thereof into another representation of the system, comprising:
- a computer-implemented extraction module (30, 32) for extracting behavior descriptions from a schematic-capture database (16), which includes the collection of components;
- a computer-implemented tagging module for assigning a keyword to each system component;
- a computer-implemented output module for outputting an output facsimile for any component which is not linked to an other form representation keyword match by said comparison module;
- a computer-implemented analysis module (34) including one or more behavior-specific translators (36, 38, 40, 46, 50, 52) for reducing the behavior description to a mathematical depiction of the components of the system;
- a computer-implemented comparison module to compare said mathematical depiction of the behavior properties of a system component to the other form component representations by matching the properties to said keywords;
- a computer-implemented decision module (68) for determining whether the component properties are expressed in primitive form of the other representation of the system;
- a computer-implemented graphical interface module including a table forming module for forming a property-value table for each component from the property-value pairs associated with a component; and
- at least one computer-implemented synthesis module (42, 54) for transforming said mathematical depiction into another representation of the system.

18. The translator of claim 17 which further includes an error-checking module (90) for examining said property-value table for errors.

19. The translator of claim 17 wherein said analysis module (34) includes a behavior specific normalizer (32b) for determining a specific character of the components from the behavior description thereof from among a predetermined character set for converting the behavior to a simplified normal form.

20. The translator of claim 19 wherein said predetermined character set is taken from the group consisting of:
- a set of nonlinear algebraic and differential equations with respect to time;
- a Laplace transform expressed as the product of rational polynomials in S;
- a Z domain transform expressed as the product of rational polynomials in Z;
- a set of poles and zeros in S representing the roots of the numerator and denominator of the associated transfer function in S;
- a set of poles and zeros in Z representing the roots of the numerator and denominator of the associated transfer function in Z; and
- a frequency response expressed as a list of frequency, magnitude and phase triplets.

* * * * *